United States Patent [19]

Smith et al.

[11] Patent Number: 5,173,697

[45] Date of Patent: Dec. 22, 1992

[54] DIGITAL-TO-ANALOG SIGNAL CONVERSION DEVICE EMPLOYING SCALED FIELD EMISSION DEVICES

[75] Inventors: Robert T. Smith, Mesa; Robert C. Kane, Scottsdale, both of Ariz.

[73] Assignee: Motorola, Inc., Schaumburg, Ill.

[21] Appl. No.: 831,701

[22] Filed: Feb. 5, 1992

[51] Int. Cl.$^5$ ............................................. H03M 1/66
[52] U.S. Cl. .................................. 341/133; 341/144; 313/336
[58] Field of Search ............................ 445/24, 50, 51; 313/309, 336, 351, 497; 341/133

[56] References Cited

U.S. PATENT DOCUMENTS

| | | | |
|---|---|---|---|
| 5,030,895 | 7/1991 | Gray | 315/350 |
| 5,064,396 | 11/1991 | Spindt | 445/50 |
| 5,103,145 | 4/1992 | Doran | 315/381 |

*Primary Examiner*—Marc Hoff
*Attorney, Agent, or Firm*—Eugene A. Parsons

[57] ABSTRACT

A digital-to-analog (D/A) signal conversion device employing scaled field emission devices to convert a digital information multi-bit input signal including data information in one of many forms such as, for example, binary or decimal, to an analog output current or voltage signal.

10 Claims, 3 Drawing Sheets

DIGITAL-TO-ANALOG SIGNAL CONVERSION DEVICE EMPLOYING SCALED FIELD EMISSION DEVICES

FIELD OF THE INVENTION

The present invention relates generally to electronic devices employing field emission devices (FEDs) and more particularly to FEDs exhibiting dis-similar electron emission characteristics.

BACKGROUND OF THE INVENTION

Field emission devices (FEDs) are known in the art and commonly employed as electronic devices. FEDs, typically, include at least an electron emitter, for emitting electrons, and an extraction electrode, proximally disposed with respect to the electron emitter. Other FED structures may employ a separate anode for collecting at least some of any emitted electrons.

Digital to analog (D/A) information conversion is a known device function. In one realization of a D/A conversion a plurality of FEDs is selectively operably interconnected as independent groups of FEDs to provide prescribed electron emission current levels determined by which of the groups of the plurality of groups is in the active (on) mode. A shortcoming of this method of realizing distinct electron emission levels is that large arrays of FEDs need be employed since each distinct electron emission level is realized by a particular group of FEDs of the array of FEDs.

Accordingly, there is a need for a digital to analog (D/A) information conversion device which overcomes at least some of these shortcomings.

SUMMARY OF THE INVENTION

This need and others are substantially met through provision of an information conversion device comprising: at least a plurality of field emission devices (FEDs) comprised of: a supporting substrate having a major surface; and an insulator layer substantially disposed on the major surface of the supporting substrate and having a plurality of apertures therethrough wherein at least some apertures have a first aperture radius associated therewith and some other apertures have at least a second aperture radius associated therewith; and an electron emitter, for emitting electrons, substantially disposed in each of at least some apertures of the plurality of apertures ; and an extraction electrode substantially disposed on at least a part of the insulator layer and peripherally, symmetrically about at least a part of some of the plurality of apertures; and at least a first anode, for collecting at least some of any emitted electrons, distally disposed with respect to the electron emitters; and at least a plurality of externally provided input signal source means selectively operably coupled between the extraction electrodes and electron emitters of at least some of the plurality of FEDs, such that a selected input signal pattern, provided by the plurality of externally provided signal source means, will provide a desired output signal.

DETAILED DESCRIPTION OF A PREFERRED EMBODIMENT

Field emission device (FED) operation (ie. electron emission) is directly related to the magnitude of an electric field which is induced proximal to the surface of an electron emitter and near the emitting tip of the electron emitter. It is known in the art that this relationship may be expressed substantially as:

$$I = \int JS$$

where:

J is the current density as a function of position with respect to the electron emission surface, and S is the electron emission surface.

The current density distribution is substantially Gaussian over the emission surface with substantially all of the meaningful electron emission occuring within the limits of $+/- \pi/2$ degrees from the normal (perpendicular to an associated supporting substrate) for an electron emitter, as commonly employed in the art, with an electron emission surface comprising a part of a substantially spherical surface on which localized non-conformities/protuberances may be disposed and generally known as the emitter tip. This yields:

$$J = J_{max}(2\pi\partial^2)^{-\frac{1}{2}} exp(-\phi^2/2\partial^2)$$

Where, from the Fowler-Nordheim relationship of the prior art $J_{max}$ is determined as, $$J_{max} = AE^2 exp(-6.83 \times 10^7 w^{3/2} v/E)$$

where:

$A = (3.18 \times 10^{-11}/V^2/w)^{\frac{1}{2}}$, $v = 0.95 - (3.79 \times 10^{-4} E^{\frac{1}{2}}/w)^2$ E is the electric field induced at the electron emitter tip surface determined as $E = dV/dz \approx \Delta V/\Delta z$, w is the surface work function of the material of which the electron emitter is comprised, and $S = 2\pi r^2 \sin\phi d\phi$ where r is taken as the radius of curvature of the representative spherical emission surface.

Substitution in the above integral yields, $$I = (2\pi r^2/\partial^2)^{\frac{1}{2}} J_{max} \int (\phi - \phi^3/3!) exp(-\phi^2/2\partial^2) d\phi$$

where the term since has been replaced by a truncated series expansion.

For a typical field emission device exhibiting a substantially Gaussian emission profile, with respect to the emission surface we may use:

$r = 300 \times 10^{-10}$ m $w = 4.0$ eV $\partial = 13.37$ deg $= 0.233$ rad.

$V = 60$ volts to determine both the electric field at the electron emitter tip and the emitted current from the FED.

Figure 1:
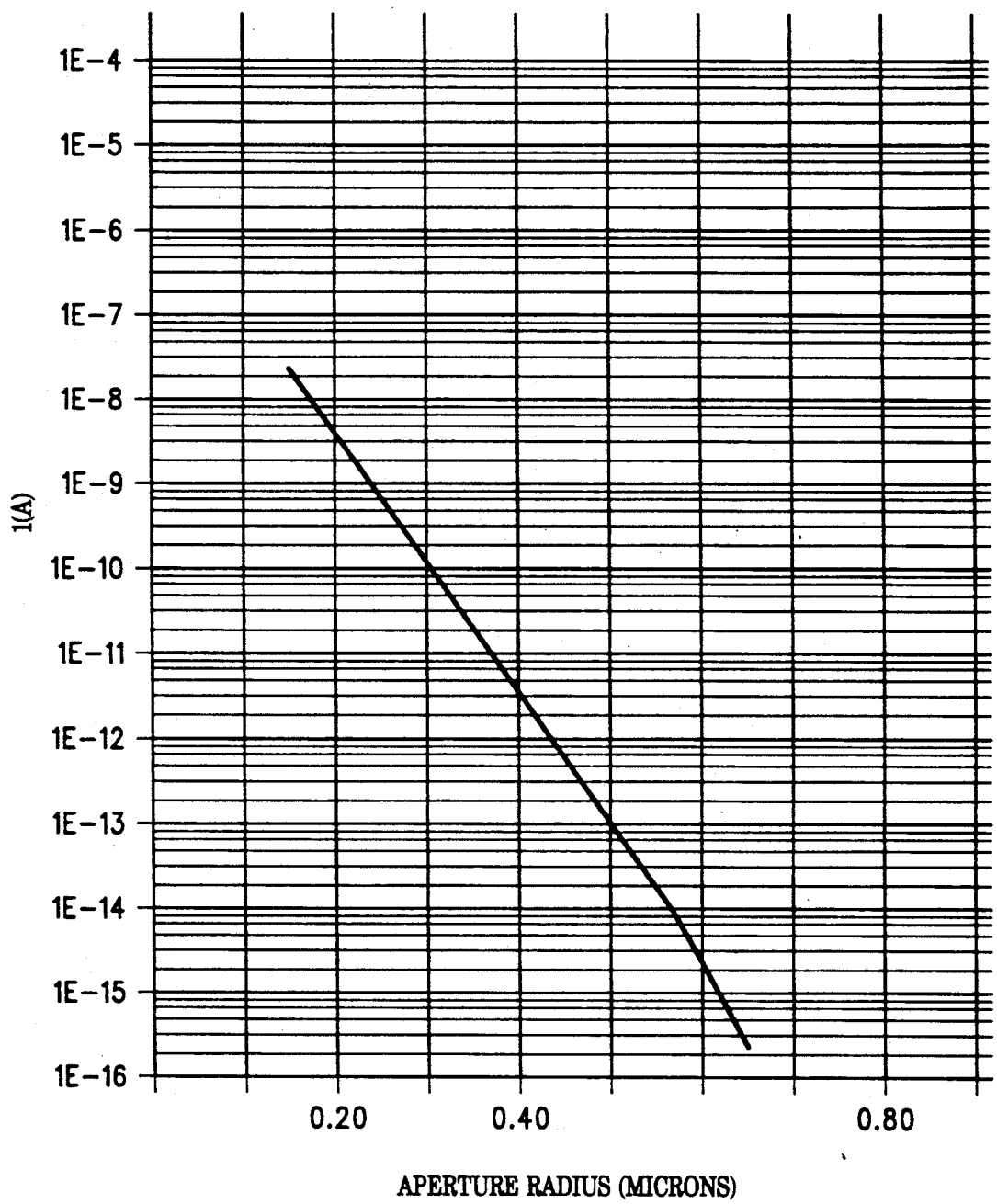
FIG. 1 is a graphical representation of the relationship which exists between emitted electron current and aperture radius with respect to FEDs.

FIG. 1 is a graphical representation of a computer model analysis which illustrates the electron emitter current, I(A), as a function of FED aperture radius. A current characteristic curve 10 clearly illustrates that as the FED aperture radius is decreased the emitted current, I(A), increases correspondingly.

Figure 2:
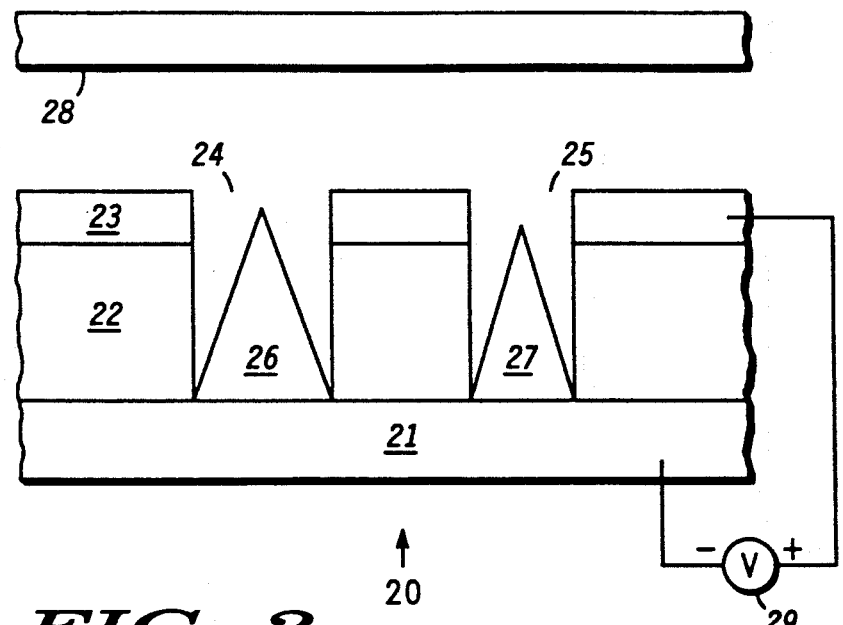
FIG. 2 is a partial side elevational cross-sectional depiction of an embodiment of an information conversion device employing a plurality of FEDs in accordance with the present invention.

Referring now to FIG. 2 there is shown a partial side elevational cross-sectional depiction of a first embodiment of an information conversion device 20. A supporting substrate 21 having a major surface is provided whereon an insulator layer 22 is substantially disposed. Insulator layer 22 is comprised of at least a plurality of apertures 24, 25 therethrough wherein some of the plurality of apertures 24, 25 are associated with a first aperture radius and other of the plurality of apertures 24, 25 are associated with a second aperture radius. An extraction electrode 23 is disposed on insulator layer 22 and substantially peripherally, symmetrically about plurality of apertures 24, 25. Electron emitters 26, 27, for emitting electrons, are disposed in apertures 24, 25 and coupled to the major surface of supporting substrate 21. So formed and depicted, the structure as described thus far comprises a plurality of FEDs. An anode 28, for collecting at least some of any emitted electrons, is distally disposed with respect to electron emitters 26, 27 of the plurality of FEDs.

Operably coupling an externally provided voltage source (signal source) 29 between extraction electrode 23 and supporting substrate 21 provides for operation of the structure as a plurality of FEDs. When operated as described electron emission current from the FEDs of the plurality of FEDs will be dis-similar due to the dissimilar aperture radii. Electron emitter 27 associated with aperture 25 having the smaller aperture radius provides an electron emission current greater than the electron emission current which is provided by electron emitter 26 associated with aperture 24 having the larger aperture radius.

Figure 3:
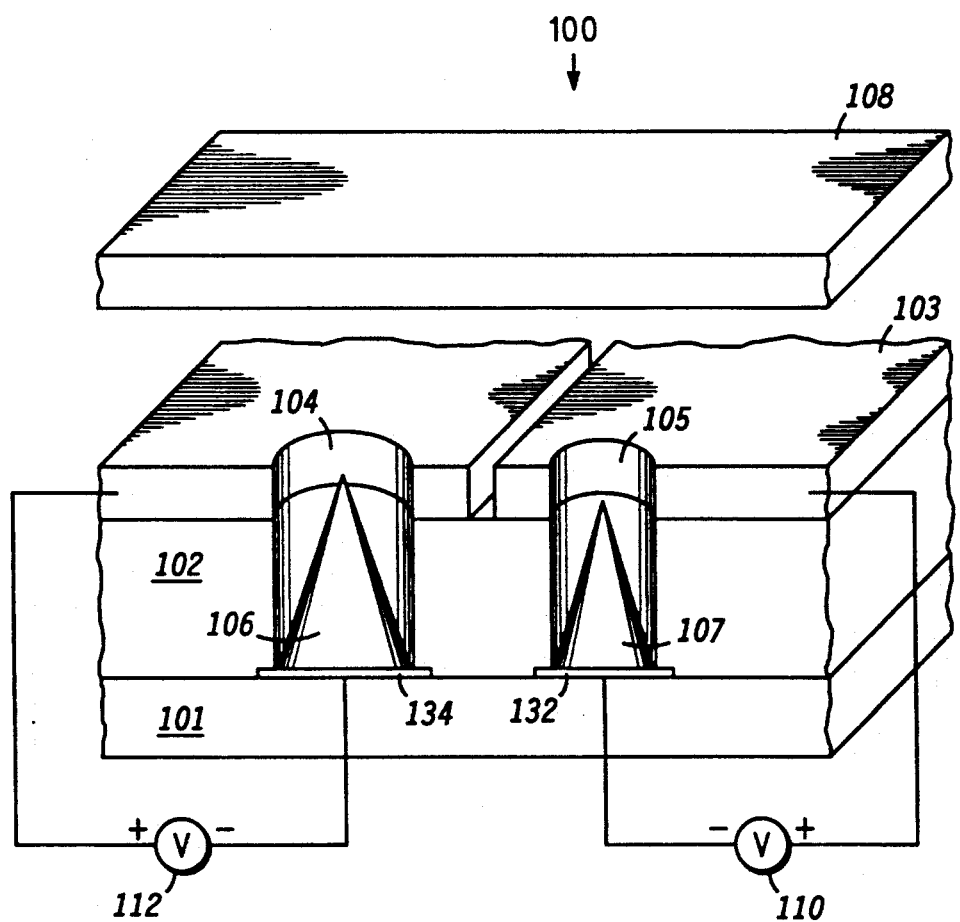
FIG. 3 is a partial perspective view of another embodiment of an information conversion device employing a plurality of FEDs in accordance with the present invention.

Referring now to FIG. 3 a partial perspective view of another embodiment of an information conversion device 100 employing a plurality of FEDs in accordance with the present invention is shown. FIG. 3 further depicts that an extraction electrode 103 is formed as a plurality of selectively patterned regions and that a plurality of externally provided voltage sources (signal sources) 110, 112 are each operably coupled to one of the plurality of distinct regions and to one of a plurality of conductive paths 132, 134. The plurality of conductive paths 132, 134 are disposed on the major surface of a substrate 101 and electron emitters 106, 107, for emitting electrons, are disposed in apertures 104, 105, respectively, and disposed on and operably coupled each to a conductive path of the plurality of conductive paths 132, 134. An anode 108, for collecting any emitted electrons, is distally disposed with respect to electron emitters 106, 107 of the plurality of FEDs.

So constructed the information conversion device of FIG. 3 is employed to provide a desired output signal as determined by a device electron emission current which is realized by applying a desired input voltage by means of the plurality of externally provided voltage sources 110, 112.

Figure 4:
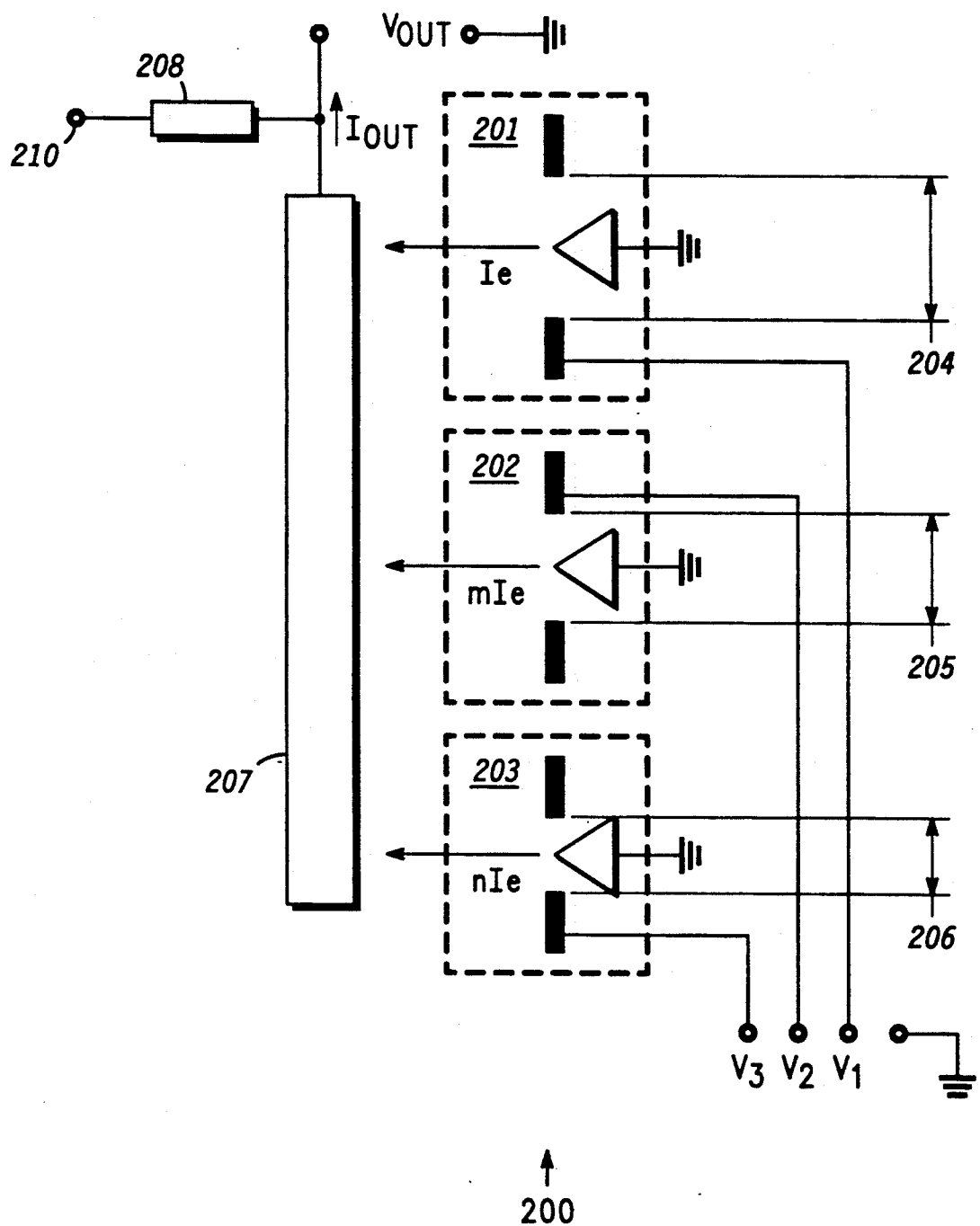
FIG. 4 is a schematic representation of an information conversion device in accordance with the present invention.

FIG. 4 is a schematic representation of an information conversion device 200 employing a plurality of dis-similar (scaled) FEDs 201, 202, 203 in accordance with the present invention. Each of the depicted FEDs 201, 202, 203 (each distinguished as being within a respective one of the dashed line boxes) includes an electron emitter, for emitting electrons, and an extraction electrode and each FED is further distinguished as having an aperture radius 204, 205, 206, respectively. The aperture radii 204, 205, 206 are dis-similar with respect to each other and will give rise to a desired electron emission current characteristic as described previously.

In the instance of information conversion device 200 a desired mathematical relationship is provided between the electron emission current of each FED of plurality of FEDs 201, 202, 203. FIG. 4 further depicts that information conversion device 200 is operated by selective application of a plurality of externally provided input signals, herein designated as V1, V2, and V3, as described previously with reference to FIGS. 2 and 3.

An anode 207, for collecting at least some of any emitted electrons, is distally disposed with respect to the electron emitters of the plurality of FEDs 201, 202, 203. An impedance element 208 is operably coupled between anode 207 and an externally provided anode voltage source 210. An output signal is realized as a voltage measured at anode 207 with reference to a reference voltage such as, for example, a ground reference or the anode voltage source 210. Alternatively, an output signal may be realized as a signal current which passes through a load element (not depicted).

Device 200, of FIG. 4, depicts that, for substantially equal input signal magnitudes applied to each of the extraction electrodes of the plurality of FEDs 201, 202, 203, the mathematical relationship is:

Ie electron emission current for the FED 201 having an aperture radius 204;

mIe electron emission current for the FED 202 having an aperture radius 105; and nIe electron emission current for the FED 204 having an aperture radius 206.

In one specific embodiment of the present invention m=2 and n=4 which defines a binary digital information input signal to analog information output signal conversion (D/A converter).

In another specific embodiment of the present invention m=10 and n=100 which defines a decimal digital information input signal to analog information output signal conversion (D/A converter).

In the instance when m=10 and n=100 for device 200, it is prescribed that a variation in input signal magnitude, over a desired range, applied to any of the plurality of FEDs 201, 202, 203 will give rise to approximately an order of magnitude variation range of electron emission current for the associated FED. So prescribed information conversion device 200 functions as a full decimal digital to analog conversion device.

It is immediately obvious that the information conversion device disclosed herein may be extended to include a larger number of conversion stages than three stages. As an example, an information conversion device employing 8 stages may be used to perform a D/A conversion of an 8-bit binary word. Correspondingly an information conversion device of 32 stages may be employed to perform a D/A information conversion of a 32-bit word.

It is anticipated that other mathematical relationships may be realized wherein the coefficients m & n assume values not specified herein and that such embodiments fall within the scope of the present invention.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An information conversion device comprising:
   a plurality of field emission devices including a supporting substrate having a major surface, an insulator layer disposed on the major surface of the supporting substrate and having a plurality of apertures therethrough wherein some apertures have a first aperture radius associated therewith and some other apertures have a second aperture radius associated therewith, an electron emitter disposed in each of the plurality of apertures, and an extraction electrode disposed on the insulator layer and peripherally, symmetrically about at least a part of the plurality of apertures;
   an anode, for collecting some emitted electrons, distally disposed with respect to the electron emitters of the plurality of field emission devices; and
   the extraction electrode and the electron emitters being constructed to have an input signal source selectively coupled therebetween such that a selected input signal pattern, provided by the input signal source, provides a desired output voltage/current signal.

2. The information conversion device of claim 1 wherein the extraction electrode includes a plurality of selectively patterned regions.

3. The information conversion device of claim 2 wherein the input signal pattern includes multi-bit digital information and the output signal includes an analog signal.

4. The information conversion device of claim 3 wherein the multi-bit digital information includes binary data.

5. The information conversion device of claim 3 wherein the multi-bit digital information includes weighted decimal data.

6. The information conversion device of claim 2 wherein a first field emission device emitted electron current associated with a field emission device including an aperture having a first aperture radius is related to a second field emission device emitted electron current associated with a field emission device including an aperture having a second aperture radius by a mathematical relationship such that the first field emission device emitted electron current is substantially two times the second field emission device emitted electron current when each of the first and second field emission devices is operated with input signals of substantially equal magnitude.

7. The information conversion device of claim 1 wherein a first field emission device emitted electron current associated with a field emission device including an aperture having a first aperture radius is related to a second field emission device emitted electron current associated with a field emission device including an aperture having a second aperture radius by a mathematical relationship such that the first field emission device emitted electron current is substantially ten times the second field emission device emitted electron current when each of the first and second field emission devices is operated with input signals of substantially equal magnitude.

8. The information conversion device of claim 7 wherein a desired variation range of an input signal magnitude of an input signal source coupled to a field emission device of the plurality of field emission devices provides for a desired variation range of emitted electron current of approximately one order of magnitude.

9. An information conversion device including a first field emission device having an aperture with a first aperture radius and a second field emission device having an aperture with a second aperture radius, different than the first radius in a predetermined relationship, such that emitted electron current in the first field emission device is a predetermined value relative to the emitted electron current in the second field emission device when each of the first and second field emission devices is operated with input signals of substantially equal magnitude.

10. A method of producing an information conversion device including the steps of:
   providing a supporting substrate having a major surface;
   disposing an insulator layer on the major surface of the substrate having a plurality of apertures formed therein, wherein at least some apertures have a first aperture radius associated therewith and some other apertures have a second aperture radius associated therewith, different than the first radius in a predetermined relationship; and
   disposing an electron emitter in each of the plurality of apertures to form a plurality of field emission devices including at least a first field emission device having an aperture with the first aperture radius and at least a second field emission device having an aperture with the second aperture radius, such that emitted electron current in the first field emission device is a predetermined value relative to the emitted electron current in the second field emission device when each of the first and second field emission devices is operated with input signals of substantially equal magnitude.

* * * * *